(12) United States Patent
Delacruz et al.

(10) Patent No.: US 11,264,361 B2
(45) Date of Patent: Mar. 1, 2022

(54) NETWORK ON LAYER ENABLED ARCHITECTURES

(71) Applicant: Invensas Corporation, San Jose, CA (US)

(72) Inventors: Javier A. Delacruz, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 55 days.

(21) Appl. No.: 16/678,342

(22) Filed: Nov. 8, 2019

(65) Prior Publication Data
US 2020/0388592 A1 Dec. 10, 2020

Related U.S. Application Data

(60) Provisional application No. 62/857,578, filed on Jun. 5, 2019.

(51) Int. Cl.
*H01L 23/52* (2006.01)
*H01L 21/82* (2006.01)
(Continued)

(52) U.S. Cl.
CPC ...... *H01L 25/0657* (2013.01); *G06F 15/7825* (2013.01); *H01L 23/53204* (2013.01);
(Continued)

(58) Field of Classification Search
CPC ......... H01L 25/0657; H01L 2924/1433; G06F 15/7825; G06F 2015/763
(Continued)

(56) References Cited

U.S. PATENT DOCUMENTS

| 6,781,407 B2 | 8/2004 | Schultz |
| 7,500,060 B1 | 3/2009 | Anderson et al. |

(Continued)

FOREIGN PATENT DOCUMENTS

| CN | 107908985 A | 4/2018 |
| JP | 2011135433 A | 7/2011 |
| KR | 100839593 B1 | 6/2008 |

OTHER PUBLICATIONS

International Search Report including Written Opinion for Application No. PCT/US2020/034565 dated Aug. 31, 2020, 10 pages.
(Continued)

*Primary Examiner* — Calvin Lee
(74) *Attorney, Agent, or Firm* — Lerner, David, Littenberg, Krumholz & Mentlik, LLP

(57) ABSTRACT

The technology relates to a system on chip (SoC). The SoC may include a network on layer including one or more routers and an application specific integrated circuit (ASIC) layer bonded to the network layer, the ASIC layer including one or more components. In some instances, the network layer and the ASIC layer each include an active surface and a second surface opposite the active surface. The active surface of the ASIC layer and the second surface of the network may each include one or more contacts, and the network layer may be bonded to the ASIC layer via bonds formed between the one or more contacts on the second surface of the network layer and the one or more contacts on the active surface of the ASIC layer.

20 Claims, 10 Drawing Sheets

(51) Int. Cl.
*H01L 25/065* (2006.01)
*H01L 25/18* (2006.01)
*H01L 23/00* (2006.01)
*G06F 15/78* (2006.01)
*H01L 23/532* (2006.01)
*G06F 15/76* (2006.01)

(52) U.S. Cl.
CPC .............. *H01L 24/08* (2013.01); *H01L 24/83* (2013.01); *H01L 25/18* (2013.01); *G06F 2015/763* (2013.01); *H01L 2224/08145* (2013.01); *H01L 2225/06524* (2013.01); *H01L 2924/1433* (2013.01); *H01L 2924/1434* (2013.01)

(58) Field of Classification Search
USPC .......................................... 438/128; 257/208
See application file for complete search history.

(56) References Cited

U.S. PATENT DOCUMENTS

| | | | |
|---|---|---|---|
| 8,042,082 B2 * | 10/2011 | Solomon | G06F 30/30 716/116 |
| 10,243,882 B1 | 3/2019 | Swarbrick et al. | |
| 10,410,694 B1 | 9/2019 | Arbel et al. | |
| 10,503,690 B2 | 12/2019 | Swarbrick | |
| 10,672,744 B2 * | 6/2020 | Teig | H01L 24/80 |
| 10,700,094 B2 * | 6/2020 | Delacruz | H01L 27/11807 |
| 10,832,912 B2 * | 11/2020 | Delacruz | H01L 24/02 |
| 2006/0056411 A1 | 3/2006 | Badat et al. | |
| 2008/0082621 A1 | 4/2008 | Han et al. | |
| 2008/0237591 A1 | 10/2008 | Leedy | |
| 2009/0070721 A1 | 3/2009 | Solomon | |
| 2009/0245257 A1 | 10/2009 | Comparan et al. | |
| 2011/0158247 A1 | 6/2011 | Toyoshima | |
| 2014/0177626 A1 | 6/2014 | Thottethodi et al. | |
| 2014/0376557 A1 | 12/2014 | Park et al. | |
| 2015/0072520 A1 | 3/2015 | Li et al. | |
| 2015/0103822 A1 | 4/2015 | Gianchandani et al. | |
| 2015/0130534 A1 | 5/2015 | Droege et al. | |
| 2017/0171111 A1 | 6/2017 | Khare et al. | |
| 2018/0074572 A1 | 3/2018 | Bauman et al. | |
| 2019/0123023 A1 | 4/2019 | Teig et al. | |
| 2019/0363717 A1 | 11/2019 | Swarbrick et al. | |
| 2020/0387471 A1 * | 12/2020 | Delacruz | H01L 25/0657 |
| 2020/0388592 A1 | 12/2020 | Delacruz et al. | |

OTHER PUBLICATIONS

International Search Repot including Written Opinion for Application No. PCT/US2020/034547 dated Sep. 15, 2020, 10 pages.

* cited by examiner

NETWORK ON LAYER ENABLED ARCHITECTURES

CROSS-REFERENCE TO RELATED APPLICATION

The present application claims the benefit of the filing date of U.S. Provisional Patent Application No. 62/857,578 filed Jun. 5, 2019, the disclosure of which is hereby incorporated herein by reference.

BACKGROUND

A system on chip (SoC) is an integrated circuit that generally includes components of a computer or other such electrical system on a single substrate in a single housing. The components within a SoC may include any combination of processors, memory, controllers, power management, network controllers, and other such computer components. By integrating these components onto a single substrate in a single housing of a SoC, the amount of space taken up by the components may be reduced relative to if the components were implemented discretely.

Communication between the components of the SoC, as well as communication between components of the SoC and off-package components, such as memory not located in the SoC housing, is controlled through the use of communication subsystems. Communication subsystems may route data between the components of the SoC via one or more computer buses and/or crossbars. As the number of components within a SoC increases, the number of buses and crossbars increases. In some instances, the length of the buses and crossbars may also increase. The increase in the number of buses and crossbars, as well as the length of the buses and crossbars may lead to communication delays and increased power usage by the SoC.

Some SoCs have implemented network-on-chip (NoC) communication subsystems. In a NoC communication subsystem, networking interfaces, each associated with a component of the SoC, packetize data to be passed to other components. The networking interfaces communicate with a set of interconnected routers which direct the packetized data to its intended destination component. A networking interface at the destination component may de-packetize the data and pass the de-packetized data into the destination component.

A NoC communication subsystem may decrease communication delays typically encountered in bus and crossbar communication subsystems by directing the packetized data through a more direct communication path to its destination component. However, NoC communication subsystems may still suffer from delays caused by inefficient communication paths resulting from the limited amount of real estate on the substrate caused by the density of components on the substrate in the SoC. In this regard, the NoC communication subsystem may need to be routed around components, thereby increasing the length of the communication paths.

Processors generally use NoC communication subsystems to retrieve date from cache memory located off of the processor die, such as L2 or L3 cache memory. Given the limited space around a processor die, the size of L2 cache memory may be limited. As such, the processor may need to rely on typically slower L3 cache memory that is located further from the processor die or off-package cache memory, such L4 cache memory which is typically located outside of a SoC. The use of a NoC communication subsystem may provide more efficient read and write operations to L3 and L4 cache than previously possible with buses and crossbar communication subsystems. However, due to the distance data needs to travel to and from the processor to L3 and L4 cache memory, the processor may be required to delay processing as it waits for data from the L3 and L4 cache memory.

SUMMARY

One aspect of the disclosure provides a system on chip (SoC). The SoC may include a network on layer including one or more routers and an application specific integrated circuit (ASIC) layer bonded to the network layer, the ASIC layer including one or more components. In some instances, the network layer and the ASIC layer each include an active surface and a second surface opposite the active surface. The active surface of the ASIC layer and the second surface of the network may each include one or more contacts, and the network layer may be bonded to the ASIC layer via bonds formed between the one or more contacts on the second surface of the network layer and the one or more contacts on the active surface of the ASIC layer. The bonds may be formed via ZiBond direct bonding and/or direct bond interconnect (DBI) hybrid bonding. In some examples the second surface of the ASIC layer includes one or more terminals.

In some instances the SoC may further include a memory layer including an active surface including one or more contacts. The memory layer may be bonded to the network layer via bonds formed between one or more contacts on the active surface of the network layer and the one or more contacts on the active surface of the memory layer. The bonds may be formed via ZiBond direct bonding and/or direct bond interconnect (DBI) hybrid bonding. Each of the one or more components may be connected at least one of the one or more routers in the network layer via one or more conductive structures. In some examples the conductive structures include one or more of traces, vias, contacts, or terminals. Each of the one or more components may include a network interface. In some examples each of the one or more components are connected to at least one of the one or more routers through their respective network interfaces. The memory layer may include one or more memory segments. Each of the one or more memory segments may be connected to at least one of the one or more routers in the network layer via one or more conductive structures. The network layer may be configured to route data between the one or more components and the one or more memory segments. The network layer may be configured to ignore faulty memory segments or faulty processors. In some examples the one or more routers of the network layer are connected via one or more routing traces in the network layer.

In some instances the network layer is connected to memory located outside of the SoC. In some instances the one or more routers are arranged in a mesh pattern, a ring pattern, or a star pattern. In some instances the one or more components include one or more of processors, graphics processing units (GPUs), logic boards, digital sound processors (DSP), or network adaptors.

Another aspect of the disclosure is directed to a method of forming a system on chip (SoC). The method may include constructing a network layer including one or more routers; constructing an application specific integrated circuit (ASIC) layer including one or more components; and bonding the network layer to the ASIC layer.

In some instances constructing the network layer includes forming an active surface having a first set of contacts and a second surface having a second set of contacts. Constructing the ASIC layer may include forming an active surface having a first set of contacts and a second surface opposite the active surface having a set of terminals. Bonding the network layer to the ASIC layer may include bonding the second set of contacts on network layer to the first set of contacts on the ASIC layer. The bonding may include ZiBond direct bonding and/or direct bond interconnect (DBI) hybrid bonding.

The method may further include constructing a memory layer; and bonding the memory layer to the network layer. In some instances constructing the memory layer includes: forming a substrate layer; forming a memory wafer; cutting the memory wafer into memory segments; and arranging one or more of the memory segments on the substrate layer. The memory layer may include a first set of contacts on an active surface. The first set of contacts on the memory layer may be bonded to the first set of contacts on the network layer. The bonding may include ZiBond direct bonding and/or direct bond interconnect (DBI) hybrid bonding.

DETAILED DESCRIPTION

The technology relates to a system on chip (SoC) having a discrete network layer. As previously described, SoCs utilize communication subsystems to enable communication between components in the SoC. However, due to the limited availability of space on the substrate of the SoC, the ability to efficiently route the communication subsystems may be impeded, potentially leading to reduced speed of data communication between components and, in some instances, resulting in processing bottlenecks. As described herein, the communication subsystem may be moved to a network layer, located above, below, or adjacent to an ASIC layer on which the components of the SoC are located. By doing such, more efficient routing of the communication subsystem may achieved as the routing of the communication subsystem may not be obstructed or otherwise limited by components on the ASIC layer. As a result, the distance data travels during communication may be reduced and the routing of the data to its destination may be more direct.

In some instances, a memory layer may be positioned above, below, or adjacent the network layer to provide increased memory availability to processors or other components on the ASIC layer. The memory on the memory layer may operate as L2 cache memory. As a result of the larger amount of L2 cache memory on the SoC, the number of requests for data from memory that is located further from the processor die, such as L3 cache memory or off-package memory, such as L4 cache memory, may be significantly reduced, thereby limiting or removing the need for off-package data requests and allowing for increased frequency of operation.

Figure 1:
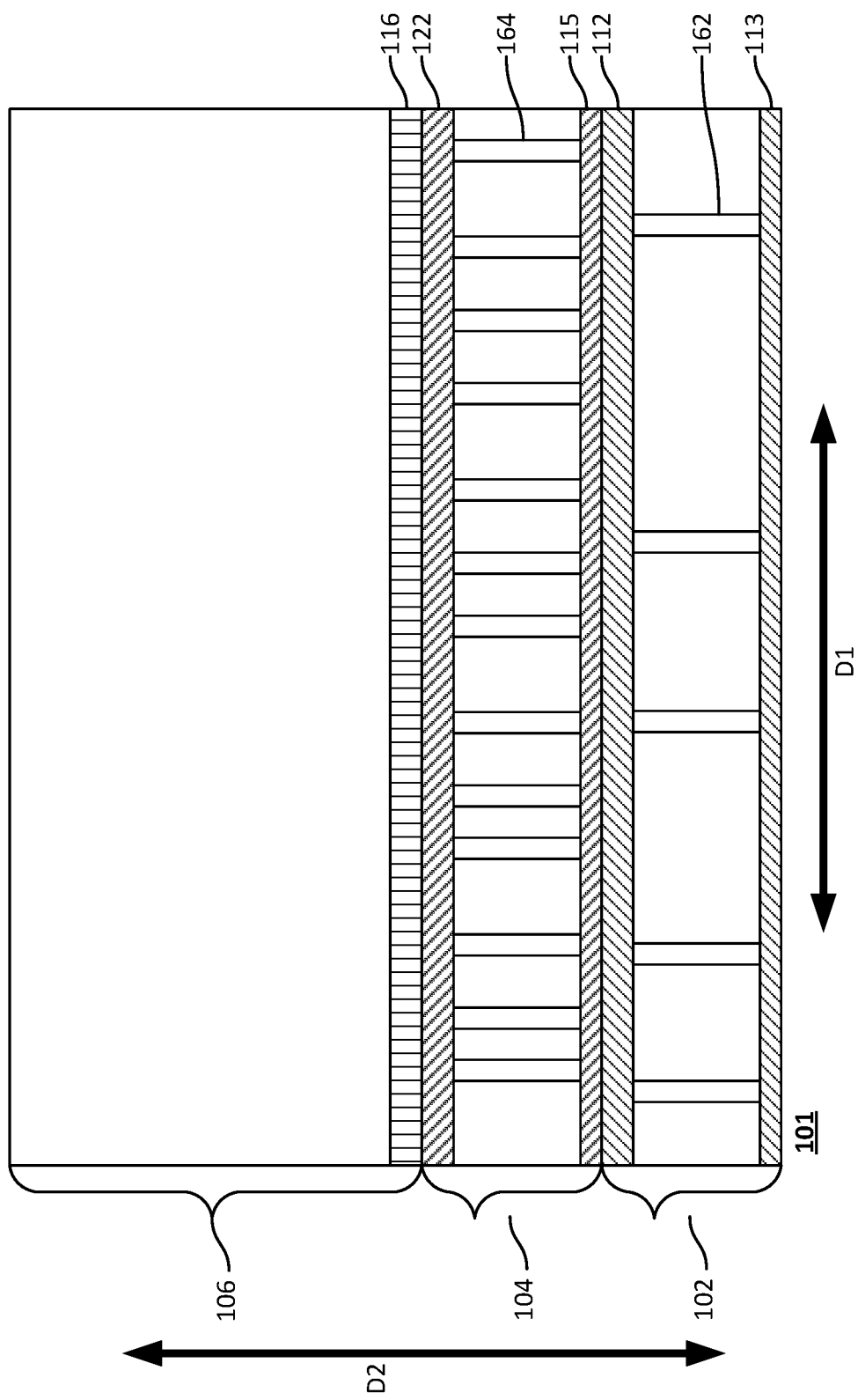
FIG. 1 is a side, cross-section view of a SoC including three layers in accordance with aspects of the disclosure.

FIG. 1 illustrates, a system on chip 101 comprised of three bonded device layers. The SoC 101 includes an application specific integrated circuit (ASIC) layer 102, a network layer 104, and a memory layer 106. The network layer 104 may have an active surface 122 and a second surface 115 opposite the active surface 122. The active surface 122 of the network layer 104 may be bonded to an active surface 116 of the memory layer 106. The second surface 115 of the network layer 104 may be bonded to an active surface 112 of the ASIC layer 102. Although not shown, a second surface 113 of the ASIC layer 102 may connect with other electrical components.

As used in this disclosure with reference to the ASIC layer 102, network layer 104, memory layer 106, or another layer having a planar surface, a statement that an electrically conductive structure, such as contacts, terminals, etc. is "at" or "on" a surface of a layer indicates that, when the respective layer is not assembled with any other element, the electrically conductive structure is available for contact with a theoretical point moving in a direction perpendicular to the surface of the layer toward the surface of the layer from outside the layer. Thus, a terminal or other conductive structure which is at a surface of a layer may project from such surface; may be flush with such surface; or may be recessed relative to such surface in a hole or depression in the respective layer. In some embodiments, the conductive structure may be attached to the surface or may be disposed in one or more layers of coating on the said surface.

Figure 2:
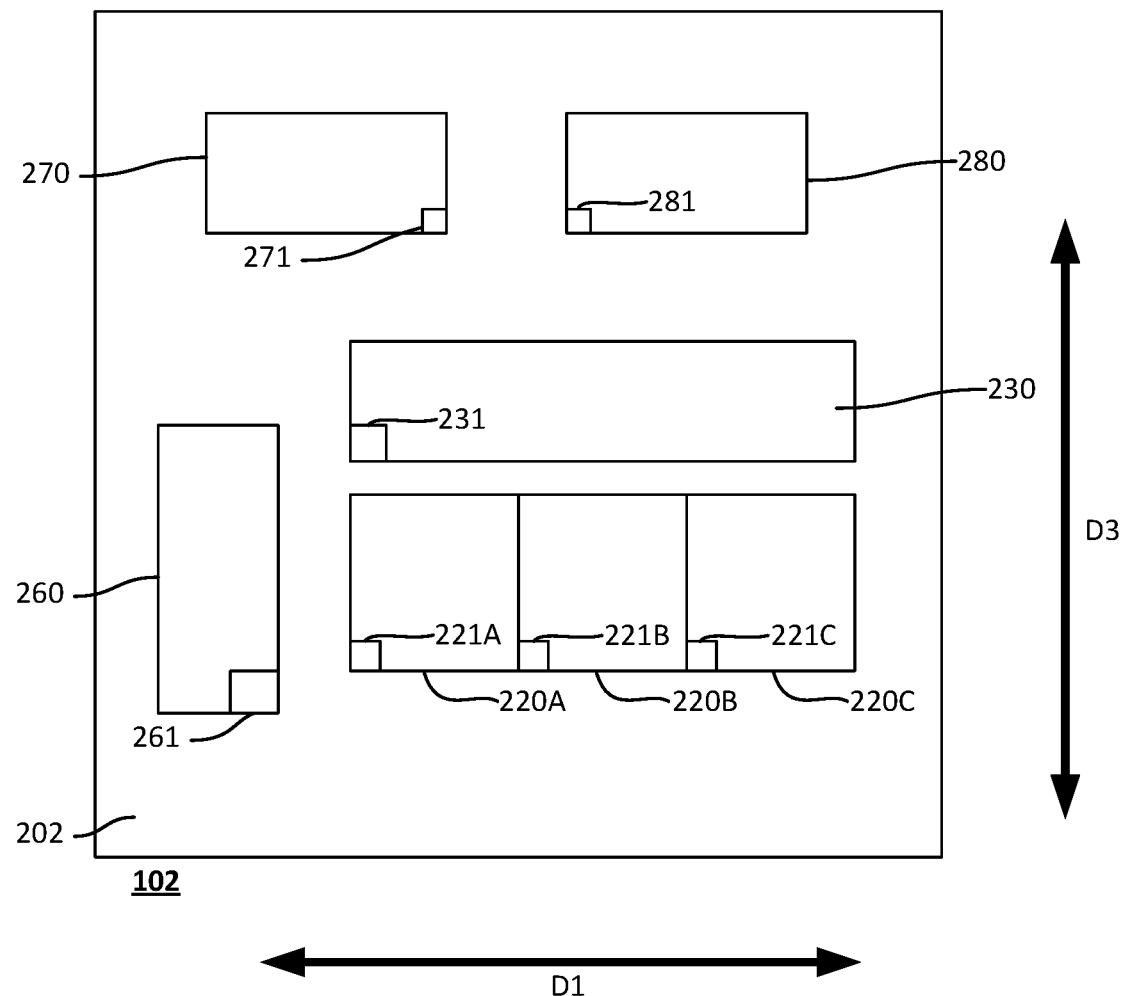
FIG. 2 is a top-down view of an application specific integrated circuit (ASIC) layer in accordance with aspects of the disclosure.

In FIG. 1, the first direction D1 is referred to herein as "horizontal" or "lateral" direction, whereas the directions perpendicular to the SoC 101, illustrated by second direction D2, is referred to herein as upward or downward direction and are also referred to herein as the "vertical" direction. FIG. 2 illustrates a third direction D3 that is perpendicular to direction D1. Direction D3 may also be considered a "horizontal" or "lateral" direction. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

FIG. 2 shows a top down view of the ASIC layer 102 with the active surface 112 removed for clarity. The ASIC layer 102 includes a substrate 202 and components mounted or otherwise positioned on the substrate 202. The components include processors 220A-220C, graphics processing unit (GPU) 230, logic board 260, digital sound processor (DSP)

270, and network adaptor 280. The ASIC layer 102 may include any combination of components typically found in an ASIC device or other such computing device. The components shown mounted on substrate 202 are for illustration purposes only. More than one ASIC layer may be included on a SoC.

Each component in the ASIC layer may include a network interface that enables the component to communicate over the network in the network layer, described herein. FIG. 2 shows network interfaces including network interfaces 221A-221C in processors 220A-220, network interface 231 in GPU 230, network interface 261 in logic board 260, network interface 271 in DSP 270, and network interface 281 in network adaptor 280. Although the network interfaces in FIG. 2 are illustrated as being within respective components, the network interfaces may be located adjacent to their respective components.

The substrate 202 of the ASIC layer 102 may be constructed from one or more semiconductor materials such as silicon, germanium, and gallium arsenide. In some embodiments, the substrate 202 (or any of the substrates disclosed herein) may be made from a material such as semiconductor material, ceramic, glass, liquid crystal polymer material, a composite material such as glass-epoxy or a fiber-reinforced composite, a laminate structure, or a combination thereof. The vertical distance between layers can be as small as microns when the layers are bonded face-to-face (e.g., active surface to active surface, active surface to second surface, or second surface to second surface, as described here). The vertical distance from the base of a layer through the layer to an adjacent face-to-face bonded layer, such that the distance includes the thickness of the layer, may be 5-55 um, although the distances may be less or more depending on the thickness of the substrates and layers. The lateral distance across a layer may be several millimeters. In this situation, additional circuitry such as repeaters, inverters and/or buffers may be needed to maintain the signal integrity needed to travel across that electrical load over that longer distance. For example, if a there is a multi-processor device, the distance needed between a given processor to a shared memory or a crossbar may be a few millimeters due to the need to traverse the width of another processor.

Referring to FIG. 1, the active surface 112 and the second surface 113 of the ASIC layer 102 may be configured to provide electrical interconnections between the ASIC layer 102 and other layers in the SoC 101 or other components external to the SoC 101. For instance, and as shown in the enlarged, side view of the ASIC layer 102 in FIG. 3, the second surface 113 may include conductive structures including terminals 303 on its lower surface 301. The terminals 303 may be configured to form electrical connections between components in the ASIC layer 102, network layer 104, and/or memory layer 106, with one or more components external to the SoC 101, such as a printed circuit board (PCB), power supply, etc. For clarity, components such as processors 220A-220C, GPU 230, etc., are not shown in the ASIC layer 102 of FIG. 3. The terminals 303 may be arranged according to a surface-mount packaging type, such as a ball grid array (BGA), pin grid array (PGA), or land grid array (LGA). In some instances there may be around 1,000 terminals at the lower surface 301 of the second surface 113.

Figure 3:
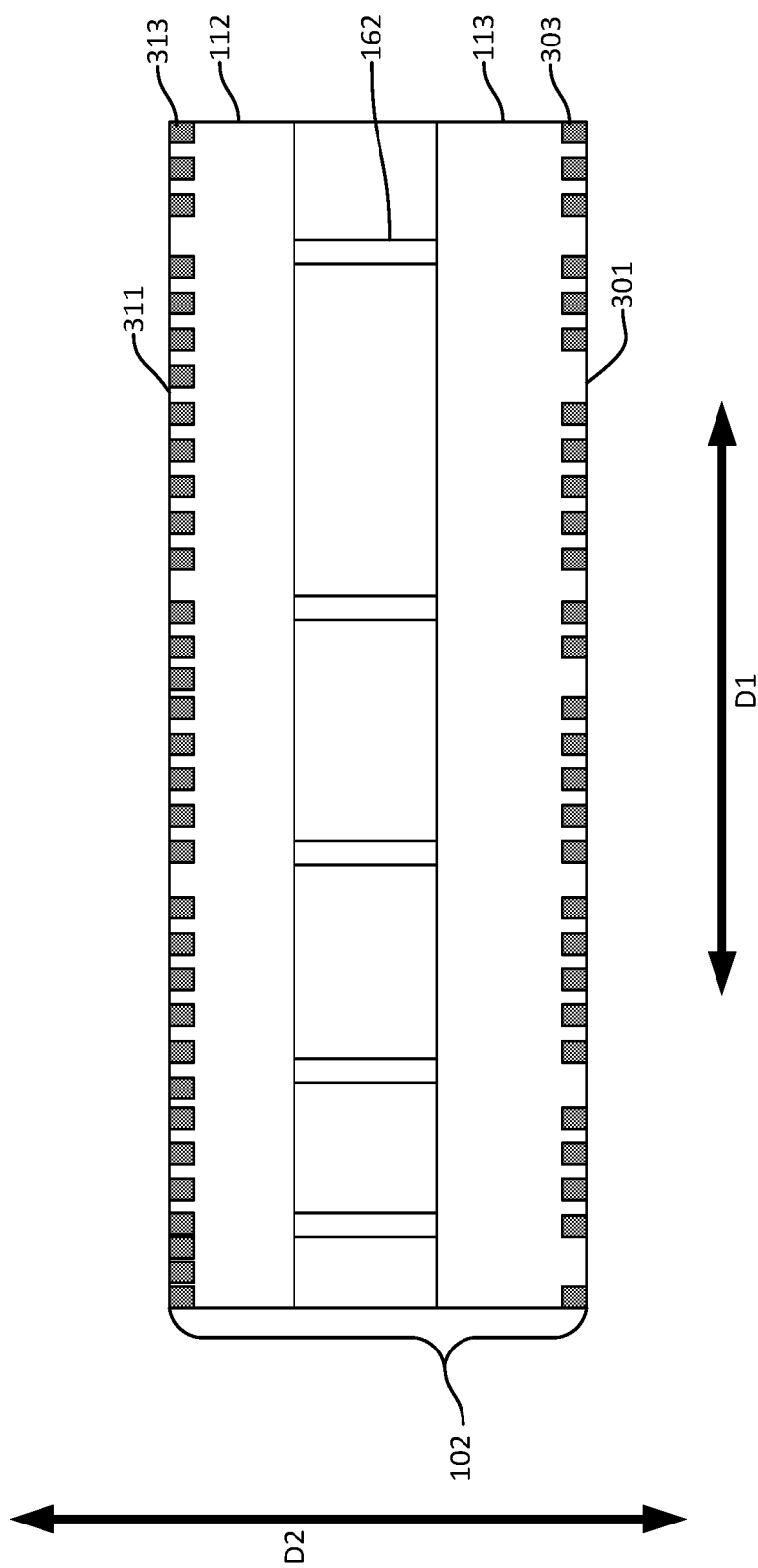
FIG. 3 is a side, cross-section view of an ASIC layer in accordance with aspects of the disclosure.

As further illustrated in FIG. 3, the active surface 112 of the ASIC layer 102 may include conductive structures including contacts 313 on its upper surface 311. The contacts 313 may be configured to align with corresponding contacts on the network layer 104 to form electrical connections between the network layer 104 and the ASIC layer 102.

Although not illustrated, the ASIC layer 102, including active surface 112 and second surface 113, may include conductive structures configured to connect components in the ASIC layer 102 (e.g., processors 220A-220C, GPU 230, etc.) through their respective network interfaces (e.g., 221A-221C, 231, etc.) with the network layer 104, other components in the ASIC layer 102, and/or the terminals 303. Such conductive structures may include traces extending in the horizontal direct D1 along the lower and upper surfaces 301,311 of the second surface and active surface 112, respectively. The traces may also extend in the direction perpendicular to D1 along the lower and upper surfaces 301,311, illustrated as direction D3 in FIG. 2. In some instances the traces may be contained within the ASIC layer 102. In some examples, components in the ASIC layer may directly connect with terminals 303 and/or with other components without the use of network interfaces.

The conductive structures may also include conductive interconnects such as vias 162 extending in the vertical direction D2 between the active surface 112 and the second surface 113, as further shown in FIG. 3. In some instances, the conductive interconnects may extend in the horizontal directions D1 and/or D2 within or on the substrate layer 102. The conductive interconnects and vias may terminate at a contact or terminal, such as terminals 303 and contacts 313. Although FIG. 3 illustrates the vias 162, as stopping at the bases of the active surface 112 and second surface 113, that is, the vias do not extend to the upper surface 111 or lower surface 301, the vias 162 may extend through and/or beyond the active surface 112 and/or second surface 113.

Figure 4:
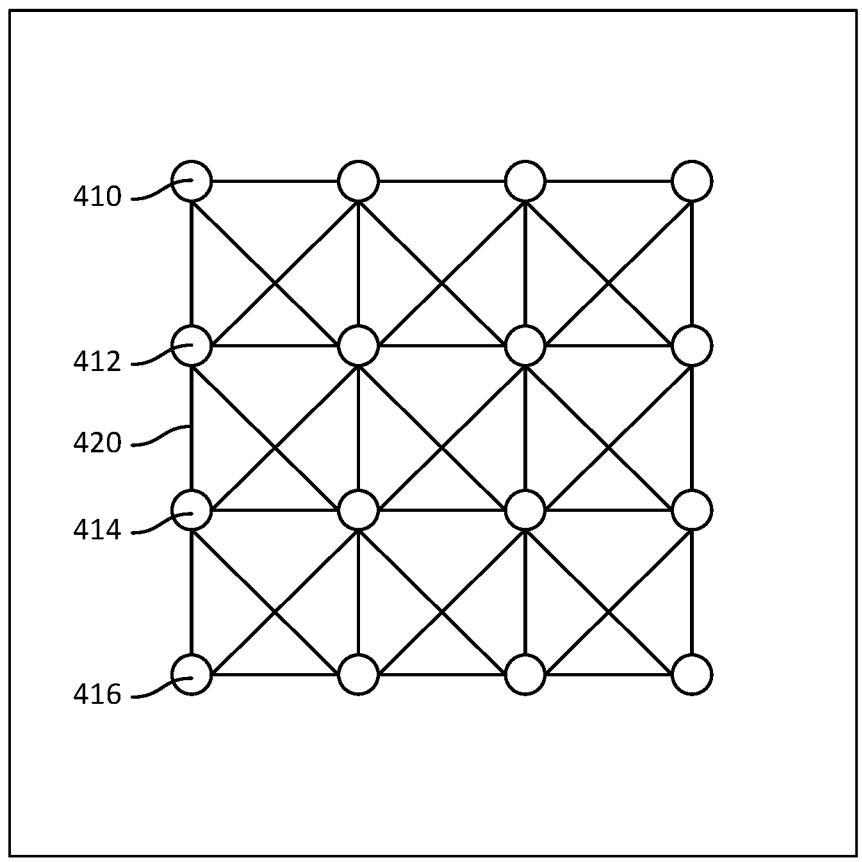
FIG. 4 is a top-down view of a network layer in accordance with aspects of the disclosure.

FIG. 4 shows a top down view of the network layer 104 with the active surface 122 removed for clarity. The network layer 104 includes networking components mounted or otherwise positioned on the network layer 104. The networking components may include routers illustrated as circles, such as routers 410-416, and routing traces illustrated as lines, such as routing trace 420. As discussed herein, the routers 410-416 and routing traces 420 may connect, through electrical interconnections formed by contacts, terminals, and other conductive structures, with memory in the memory layer 106. The routers may also connect with the components in the ASIC layer 102 through the networking interfaces. Although sixteen routers are shown in FIG. 4, any number of routers may be present in the network layer 104. Other components, which may include active or passive components, including capacitance layers, clock structures (e.g., tree or part of tree clock structures) memory, and/or analog circuits may also be included in the network layer.

The network layer 104 may be constructed from one or more semiconductor materials or other materials described herein with regard to the substrate 202. In some instances, more than one network layer may be included on a SoC. By providing additional network layers, larger blockages, such as from taller stacks formed from stacking multiple layers (e.g., memory layers, network layers, and/or ASIC layers) may be routed around.

As mentioned herein, the ability to efficiently route a communication subsystem on an ASIC layer may be impeded by limitations in space and blockages created by large components, such as a chip die, on the ASIC layer. Such limitations and blockages may potentially lead to inefficient network routings which may in turn reduce the speed of data communication between components and, in some instances, result in processing bottlenecks. By moving the networking components to the network layer located above, below, or adjacent to an ASIC layer, more efficient routing of the communication subsystem may achieved as the routing of the communication subsystem may not be obstructed or otherwise limited by components on the ASIC layer. As a result, the distance data travels during communication may be reduced and the routing of the data to its destination may be more direct.

Figure 5:
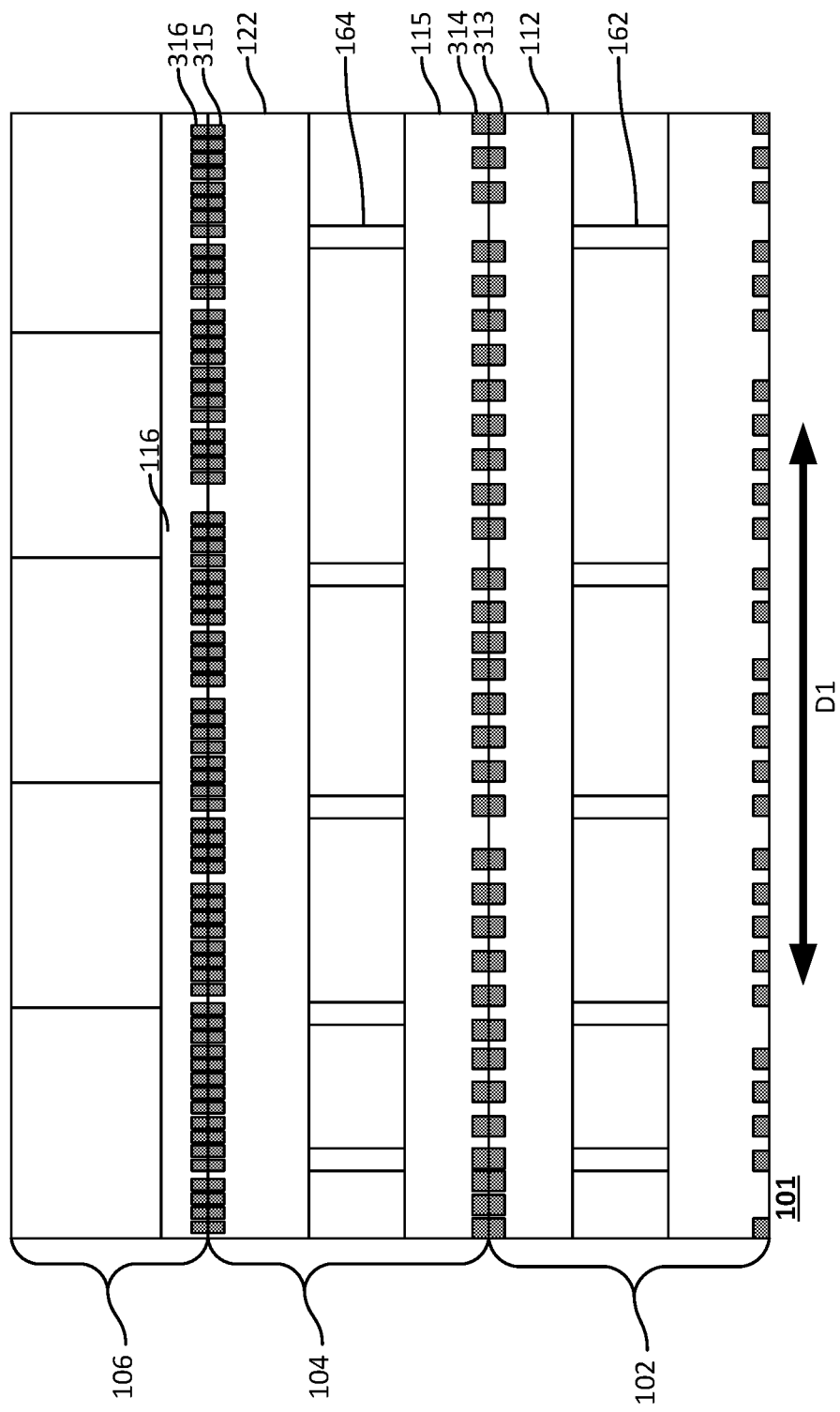
FIG. 5 is a cross-section, side view of the interconnections of layers of an SoC in accordance with aspects of the disclosure.

FIG. 5 depicts a cut-away side view of the interconnections of the ASIC layer 102, network layer 104, and memory layer 106 through contacts. In this regard, the active surface 122 and the second surface 115 of the network layer 104 may be configured to provide electrical interconnection between the network layer 104 and other layers in the SoC 101. For instance, and similar to the active surface 112 of the ASIC layer 102, the active surface 122 and second surface 115 of the network layer 104 may each include contacts 315, 314 on their respective surfaces. The contacts 314 on the second surface 115 of the network layer 104 are positioned such that they align with contacts 313 on the surface of the active surface 112 of the ASIC layer 102. In some instances, there may be hundreds of thousands of electrical connections formed by contacts on the network layer 104 and the ASIC layer 102.

Contacts 315 on the active surface 122 of the network layer 104 may be arranged such that they align with contacts on another layer positioned above the network layer, such as the active surface 116 of the memory layer 106.

Although not illustrated, the network layer 104, including active surface 122 and second surface 115 may include conductive structures configured to connect components, such as the routers 410-416 with the ASIC layer 102 and/or the memory layer 106 via the contacts 314 and/or 315. The conductive structures may be the same as those described herein with regard to the ASIC layer 102, such as traces and interconnects, including vias 164 shown in FIGS. 1 and 5.

As further shown in FIG. 5, the memory layer 106 includes an active surface 116 on which a plurality of contacts may be arranged. The contacts may be arranged such that they align with contacts 315 of the network layer 104. There may be millions of electrical connections formed by the contacts on the network layer 104 and the memory layer 106.

Figure 6:
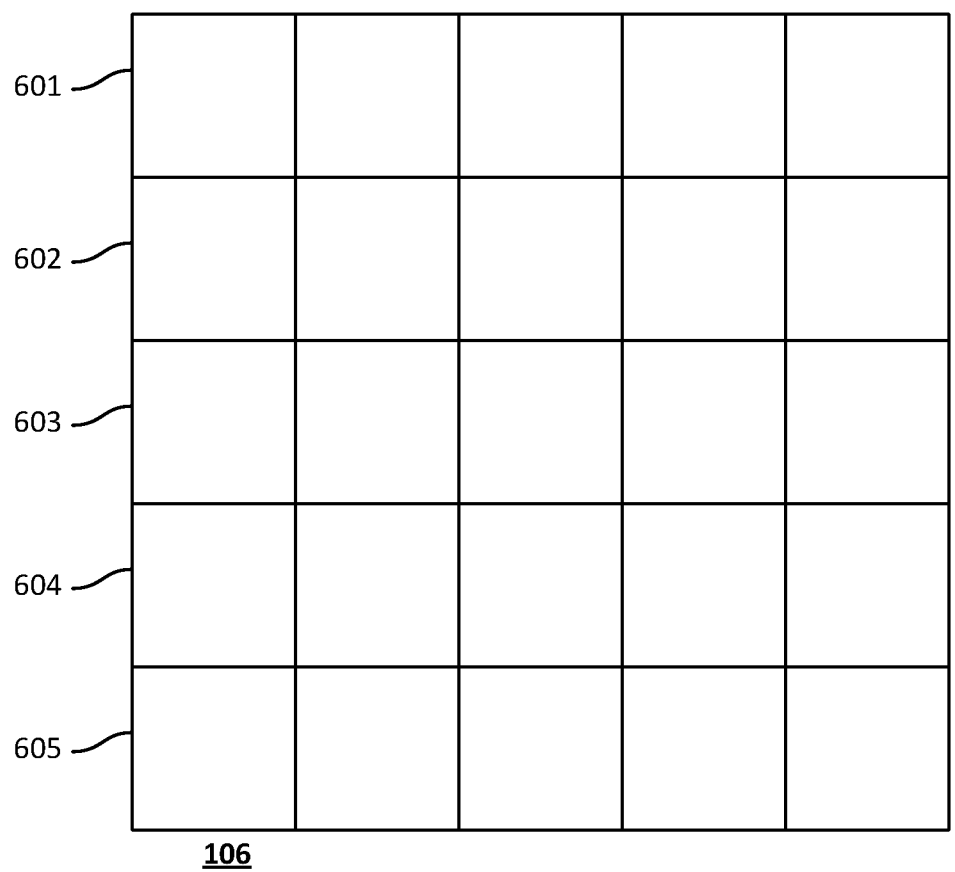
FIG. 6 is a top-down view of a memory layer in accordance with aspects of the disclosure.

The memory layer may include one or more memory segments. For instance, and as shown in FIG. 6, memory layer 106 includes 25 memory segments, including memory segments 601-605, although any number of memory segments may be possible. The memory segments may be NAND memory or other such volatile and non-volatile memory including MRAM, NRAM, FE-RAM, etc.

Production of the memory segments may include creating a memory wafer and cutting the memory wafer into memory segments of a chosen size. In this regard, each memory wafer may have the same design to allow for reusability of the memory segments by different SoC designs. For instance, the memory wafer may be created in set increments, such as 1×1 mm, 2×2 mm, 4×4 mm, etc. The memory wafer may then be cut or otherwise separated into memory segments sized for the SoC they are being used. For example, the die size of SoC 101, that is the size of the ASIC layer 102, may be 10×10 mm. To form memory layer 106, four memory wafers having a size of 5×5 mm may be cut into 1×1 mm segments, resulting in 100 1×1 mm memory segments being formed. The 100 memory segments may then be arranged in the memory layer 106 such that the memory layer 106 has the same size as the die (10×10 mm). Although the memory segments are described as being 1×1 mm in the foregoing example, the memory segments may be any size. For instance, a 20×20 mm die may have a corresponding memory layer made up of a 10×10 array of 2×2 mm memory segments or a 10×20 mm die may have a corresponding memory layer including a 5×10 array of 2×2 mm memory segments. In some instances, multiple memory segments may be formed on the same wafer. For instance, a 10×10 mm memory array may be made up of a 10×10 mm memory wafer having two 5×10 mm memory segments. In other words, memory segments may be formed directly on a wafer, as opposed to by cutting the wafer.

The size of the memory layer 106 may be the same or different than the ASIC layer 102 and network layer 104. In some instances, the dimensions of the memory layer, such as its width and length may match a multiple of the memory dimensions so that the interconnection of the memory layer coincides with the other layer. In another embodiment, a die-to-wafer assembly may be used. In this embodiment the memory layer may not be matched to the ASIC layer or network layer, but the network layer may match the memory layer or ASIC layer.

The layers of the SoC 101 may be bonded in a stacked arrangement using various bonding techniques, including using direct dielectric bonding, non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety). This process may enable the contacts 313 on the active surface 112 of the ASIC layer 102 to bond to the contacts 314 in the second surface 115 of the network layer 104. Similarly, this process may enable the contacts 315 on the active surface 122 of the network layer 104 to bond to the contacts 316 in the active surface 116 of the memory layer 106. The contacts may have an extremely fine pitch. For example, the contacts may be at a pitch as low as approximately 1μ-10μ, or in some instances, as low as around 100 nm or greater that 10μ.

In some examples the SoC may include fewer than three layers or more than three layers. For instance, the SoC may include only a network layer and an ASIC layer. In another example, the SoC may include a network layer, an ASIC layer and multiple memory layers. In some instances, the memory layer, such as memory layer 106 may be replaced by another layer type, such as an additional ASIC layer. In this regard, the network layer may be configured to connect the two ASIC layers together.

Figure 7:
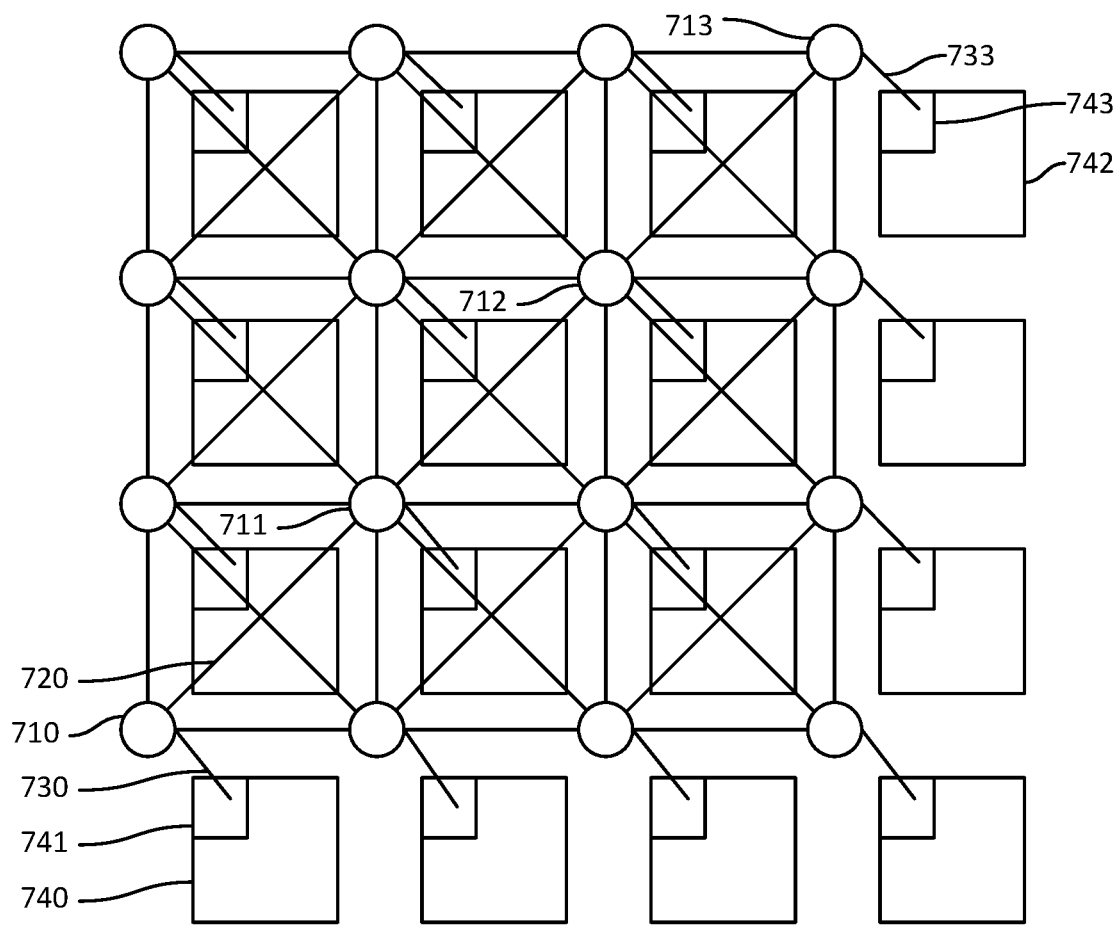
FIG. 7 is a top-down view of components of a network layer and ASIC layer in accordance with aspects of the disclosure.

FIG. 7 shows the interconnection of components of a network layer with components of an ASIC layer. In this regard, routers 710-713 are connected via routing traces 720 on the network layer. Although FIG. 7 illustrates the components of the network being configured in a mesh topology, the network may be configured in any topology such as a ring topology, start topology, etc.

The ASIC layer includes a plurality of processors, including processors 740 and 742 that include network interfaces 741 and 743, respectively. The components of the ASIC layer are connected to the network layer via conductive structures, including conductive structures 730 and 733 that connect network interfaces 741 and 743 to router 710 and 713, respectively. Although FIG. 7 illustrates the conductive structures as single lines, the conductive structures may include any combination of terminals, contacts, vias, conductive interconnects, etc. as described herein. Moreover, although FIG. 7 shows only processors in the ASIC layer, other components such as GPUs, DSPs, etc. may be present in the ASIC layer.

Figure 8:
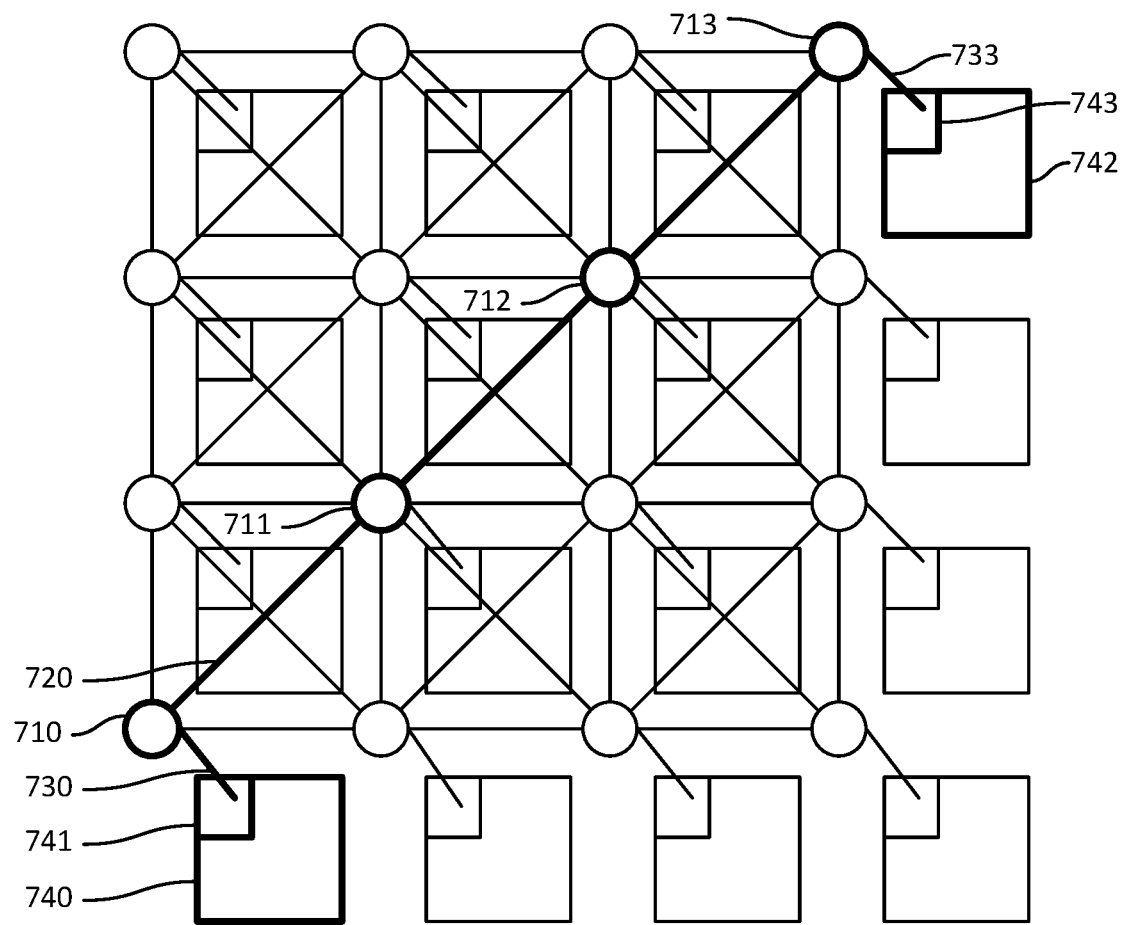
FIG. 8 is a top-down view of a data communication path through a network layer and ASIC layer in accordance with aspects of the disclosure.

FIG. 8 illustrates a data communication path between processor 740 and processor 742 via a network layer. In this regard, network interface 741 of processor 740 may send data via conductive structure 730 from the ASIC layer to router 710 on the network layer. Router 710 may direct the data to router 711 via routing trace 720, which in turn may direct the data to router 712, which in turn may direct the data to router 713 via other routing traces. From router 713, the data may be directed from the network layer to the network interface 743 of processor 742 on the ASIC layer via conductive structure 733. The entire path and corresponding components and traces the data traversed from processor 740 to 742 is shown in thickened lines in FIG. 8. In some instances, an entire die may be traversed via the network layer within 2-3 clock cycles. The example shown in FIG. 8 is merely illustrative, and any other path through other routers and routing traces may be possible.

Figure 9:
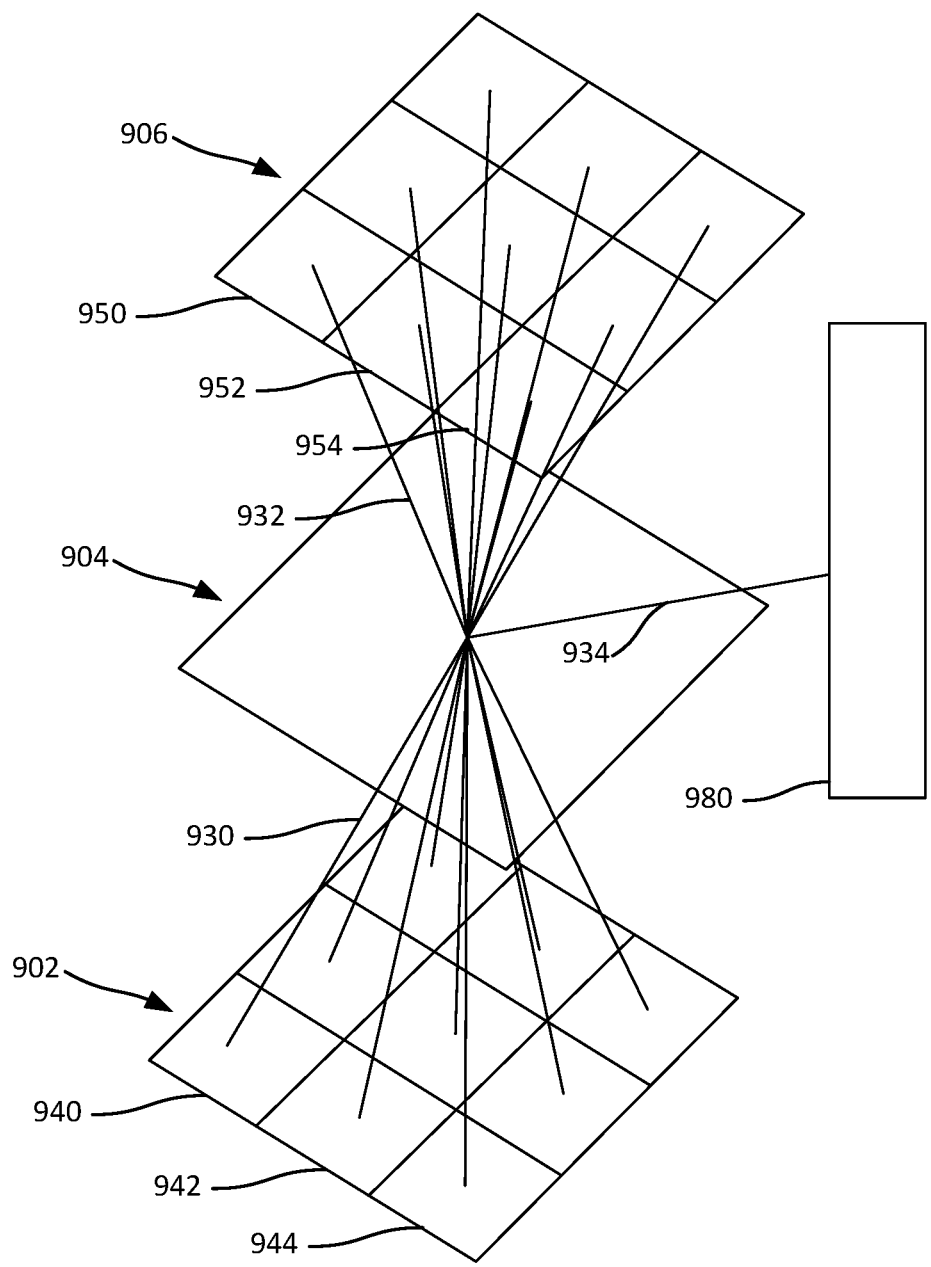
FIG. 9 shows the interconnection of layers in the SoC in accordance with aspects of the disclosure.

FIG. 9 shows the interconnection of ASIC layer 902 with memory layer 906 through network layer 904. In this regard, processors or other components on the ASIC layer, including processors 940-944 connected via conductive structures 930 to the network layer 904. The network components on the network layer 904 are connected to memory segments, such as memory segments 950-954 in the memory layer 906 via conductive structures 932. For clarity, networking components, including routers and routing traces are not shown in the network layer 904 in FIG. 9. It should be understood that each component in the ASIC layer 902 connects to one or more routers in the network layer 904.

To read and write data to memory segments in the memory layer 906, a processor such as processor 940, or another component in the ASIC layer 902, may pass data and/or instructions to the network layer 904 via conductive structures 930. The routers may direct the data and/or instructions to the appropriate memory segments, such as memory segment 950, on the memory layer 906. Given the proximity of the memory layer 906 to the components in the ASIC layer 902, the memory segments, such as memory segments 950-952 in the memory layer may effectively operate as L2 cache memory.

In some instances the routers may direct data and/or instructions to memory located off of the SoC package. For example, and as further illustrated in FIG. 9, L3 memory 980 may be connected to the network layer 904 via one or more conductive structures, such as conductive structure 934. In operation, a processor or other component of the ASIC layer 902 may pass instructions and/or data to the network layer 904. The data and/or instructions may be routed through the networking layer via one or more routers to conductive structure 934. The data and/or instructions are passed through the conductive structure 934 to the L3 memory 980. The routers may direct data and/or instructions to other devices, such as other processors, located off the SoC package via one or more conductive structures.

Figure 10:
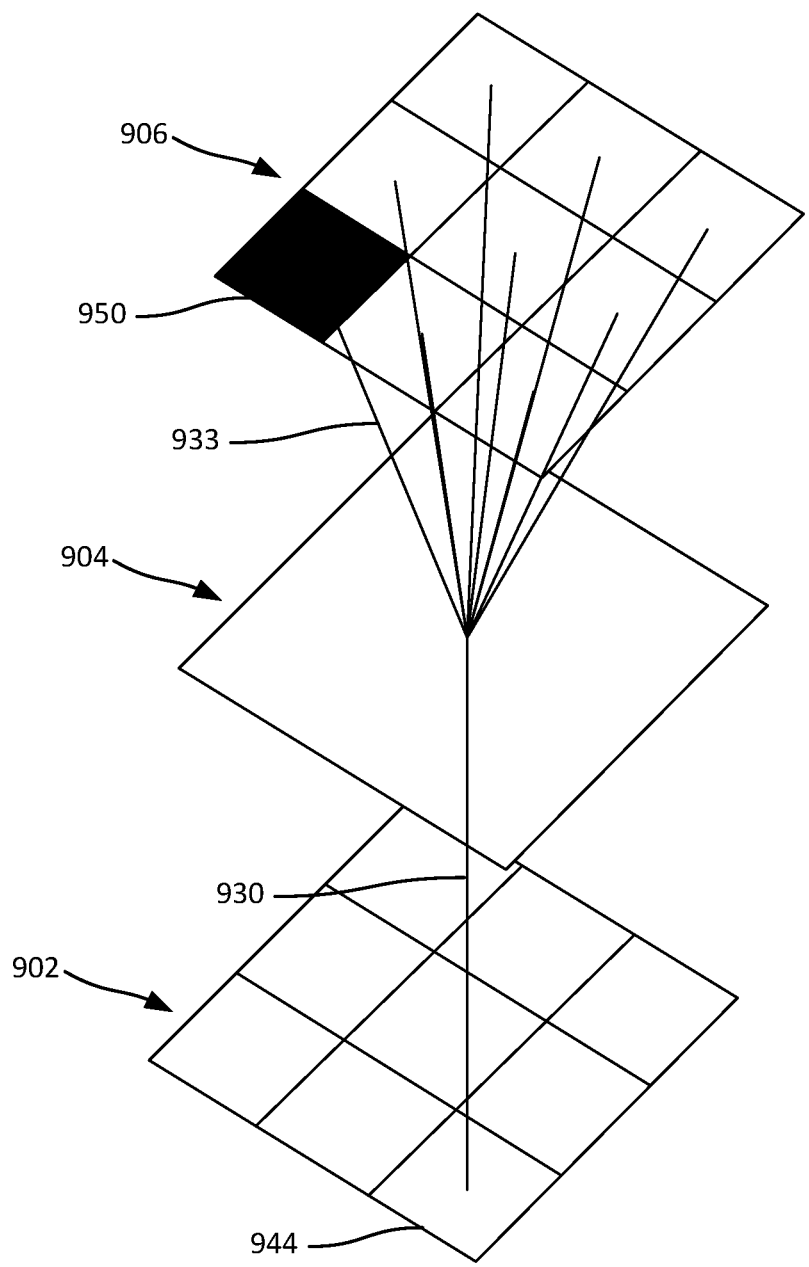
FIG. 10 is a perspective view of layers in the SoC including a memory layer with a defective memory segment in accordance with aspects of the disclosure.

In some instances, the network layer may be configured to disregard faulty or otherwise nonfunctional memory segments. For example, and as illustrated in FIG. 10, memory segment 950 on memory layer 906 may be faulty. As a result, network layer 904 may ignore memory segment 950 by not routing any data to that memory segment via conductive structure 933. Faulty memory segments may be determined by performing known memory testing during production of the SoC or memory, such that an e-fuse can set bad sectors. In some instances, faulty memory segments may be detected during operation (down cycles) or during boot-up of the SoC. In this regard, a basic MBIST (Memory Built-in Self-Test) can evaluate the sectors in each memory segment to determine which segments or sectors in the segment are fully operational and which ones are not. Conversely the same approach may apply to a multi-processor approach where the network layer can ignore and route around faulty processors or processing elements arranged on the ASIC layer or other layer.

Although the layers described above are identified as having distinct components and features, such as a memory layer having memory, a network layer having networking components, and an ASIC layer including computing components, each layer may include components associated with another layer. For instance, memory layers may include networking components and/or computing components, network layers may include memory and/or computing components, and ASIC layers may include networking components and/or memory.

The invention claimed is:

1. A system on chip (SoC) comprising:
a network layer including two or more routers; and
an application specific integrated circuit (ASIC) layer bonded to the network layer, the ASIC layer including two or more components, including a first component having a first network interface and a second component having a second network interface, wherein the first component is connected to a first router of the two or more routers via the first network interface and the second component is connected to a second router of the two or more routers via the second network interface,
wherein the first router and the second router of the two or more routers are configured to route data through the network layer from the first network interface of the first component to the second network interface of the second component.

2. The system of claim 1, wherein the two or more components include one or more of processors, graphics processing units (GPUs), logic boards, digital sound processors (DSP), or network adaptors.

3. The system of claim 1, wherein the two or more routers of the network layer are connected via one or more routing traces in the network layer.

4. The system of claim 1, wherein the two or more routers are arranged in a mesh pattern, a ring pattern, or a star pattern.

5. The system of claim 1, wherein the network layer is connected to memory located outside of the SoC.

6. The system of claim 1, wherein the network layer and the ASIC layer each includes:
an active surface; and
a second surface opposite the active surface.

7. The system of claim 6, wherein the second surface of the ASIC layer includes one or more terminals.

8. The system of claim 6, wherein the active surface of the ASIC layer and the second surface of the network layer each includes one or more contacts,
wherein the network layer is bonded to the ASIC layer via bonds formed between the one or more contacts on the second surface of the network layer and the one or more contacts on the active surface of the ASIC layer.

9. The system of claim 8, wherein the bonds are formed via ZiBond direct bonding and/or direct bond interconnect (DBI) hybrid bonding.

10. The system of claim 1, further including a memory layer including an active surface including one or more contacts.

11. The system of claim 10, wherein the memory layer is bonded to the network layer via bonds formed between one or more contacts on the active surface of the network layer and the one or more contacts on the active surface of the memory layer.

12. The system of claim 11, wherein the bonds are formed via ZiBond direct bonding and/or direct bond interconnect (DBI) hybrid bonding.

13. The system of claim 10, wherein each of the two or more components is connected at least one of the two or more routers in the network layer via one or more conductive structures.

14. The system of claim 13, wherein the conductive structures include one or more of traces, vias, contacts, or terminals.

15. The system of claim 13, wherein each of the two or more components include a network interface.

16. The system of claim 15, wherein each of the two or more components are connected to at least one of the two or more routers through their respective network interfaces.

17. The system of claim 15, wherein the memory layer includes one or more memory segments.

18. The system of claim 17, wherein each of the one or more memory segments is connected to at least one of the two or more routers in the network layer via one or more conductive structures.

19. The system of claim 17, wherein the network layer is configured to route data between the two or more components and the one or more memory segments.

20. The system of claim 17, wherein the network layer is configured to ignore faulty memory segments or faulty processors.

* * * * *